United States Patent [19]
Madden, Jr. et al.

[11] Patent Number: 5,595,668
[45] Date of Patent: Jan. 21, 1997

[54] LASER SLAG REMOVAL

[75] Inventors: Jean D. Madden, Jr., Warwick, R.I.; Christopher H. Knapp, North Attleboro, Mass.

[73] Assignee: Electro-Films Incorporated, Warwick, R.I.

[21] Appl. No.: 417,092

[22] Filed: Apr. 5, 1995

[51] Int. Cl.⁶ .................................................. H05K 3/00
[52] U.S. Cl. ............................ 216/17; 216/39; 216/108
[58] Field of Search ................................. 216/13, 17, 18, 216/39, 56, 65, 83, 96, 101, 108, 57; 219/121.71

[56] References Cited

U.S. PATENT DOCUMENTS

| | | | |
|---|---|---|---|
| 3,360,398 | 12/1967 | Garibotti | 216/96 |
| 3,524,038 | 8/1970 | O'Kelly, Jr. | 219/70 |
| 3,626,141 | 12/1971 | Daly | 219/121 |
| 3,736,402 | 5/1973 | Mefferd et al. | 219/121 |
| 3,742,182 | 6/1973 | Saunders | 219/121 |
| 3,846,905 | 11/1974 | Harper | 29/589 |
| 3,866,398 | 2/1975 | Vernon, Jr. et al. | 156/17 |
| 3,867,217 | 2/1975 | Maggs et al. | 216/65 X |
| 3,997,358 | 12/1976 | Taylor | 134/7 |
| 4,224,101 | 9/1980 | Tijburg et al. | 156/643 |
| 4,262,186 | 4/1981 | Provancher | 219/121 |
| 4,417,125 | 11/1983 | Tsutsumi | 219/121 |
| 4,425,380 | 1/1984 | Nuzzi et al. | 216/83 X |
| 4,447,701 | 5/1984 | Brown | 219/121 |
| 4,544,577 | 10/1985 | May | 427/97 |
| 4,857,698 | 8/1989 | Perun | 219/121.7 |
| 4,950,861 | 8/1990 | Erlenmaier et al. | 219/121.67 |
| 4,987,286 | 1/1991 | Allen | 219/121.68 |
| 5,158,645 | 10/1992 | Covert et al. | 216/13 |
| 5,493,096 | 2/1996 | Koh | 219/121.71 |

*Primary Examiner*—Thi Dang
*Attorney, Agent, or Firm*—Weingarten, Schurgin, Gagnebin & Hayes LLP

[57] ABSTRACT

A process is provided for removing slag from an aperture in a substrate, comprising the steps of: providing a protective coating on the substrate; drilling a hole through the substrate; and chemically removing slag from the aperture by complete or partial immersion of the substrate into a chemical bath. Additional process steps can include cleaning the stripped substrate and baking the substrate at a high temperature. A base coating can be provided on the substrate to promote adhesion of a chemically resistant coating to the substrate. Additionally, a protective coating can be applied to the chemically resistant coating to protect it during drilling. The chemically resistant layer can be a material, such as gold, that does not oxidize or dissolve when it is exposed to a chemical, such as phosphoric acid. Phosphoric acid can be heated to accelerate slag removal.

20 Claims, 1 Drawing Sheet

5,595,668

LASER SLAG REMOVAL

FIELD OF THE INVENTION

The present invention relates to removal of a relatively weakly attached material from the wall of a laser drilled hole in a substrate, and more particularly to a process for removing slag using a chemical bath.

BACKGROUND OF THE INVENTION

Metal-lined through-holes and metal wrap-around edges provide an electrical connection between first and second sides (front and back) of a substrate at selected locations. The metal-lined through-holes can also function as heat sinks. One technique for making the hole or via, to which metal is subsequently applied to make the metal-lining or into which metal is applied to provide a filled via, is laser drilling.

When a hole is laser drilled through a substrate such as a ceramic plate, the wall of the resulting hole often includes a thin zone of material that is crack-networked and somewhat crumbly or friable, and which has some glassy character. This wall material is frequently referred to as slag or melt. Not infrequently, the front and back sides of the substrate proximate the laser drilled hole include small cracks.

It should be noted that the existence of slag, however, has adverse consequences with respect to both subsequent processing and the final product. For example, liquid (in some cases a solution of a thermally unstable solid) is easily trapped by the slag during cleaning or other wet processing steps. As the liquid trapped by the slag vaporizes during baking, it causes blistering of the substrate. The resulting product is then not usable. Additionally, the slag can cause mechanical weakness by providing an unstable foundation for a subsequently applied layer of conductive metal.

SUMMARY OF THE INVENTION

The present invention provides a process for removing slag from an aperture in a substrate, comprising the steps of: providing a protective coating on the substrate; drilling a hole through the substrate; and chemically removing slag from the aperture.

According to the invention, a base coat can be provided on a substrate to promote adhesion of a chemically resistant coating to the substrate. Additionally, a protective coating can be applied to the chemically resistant layer to protect it during drilling. The chemically resistant layer can be a material, such as gold, that does not oxidize when exposed to an acid, such as phosphoric or hydrofluoric acid which can be heated to accelerate slag removal.

In an exemplary process for preparing a substrate for through-hole metalization, a planar substrate having a first side and a second side is provided with a protective coating on each side. At least one aperture is laser drilled through the coated substrate which is immersed, at least in part, in a chemical bath. The substrate is removed from the chemical bath and the protective coating is removed.

In another exemplary process for preparing a substrate for through-hole metalization, a ceramic substrate having a first side and a second side is coated with an adhesion-promoting material. The adhesion-promoting material is coated with an acid resistant material which is coated with an organic coating. At least one aperture is laser drilled through the coated ceramic substrate, after which the organic coating is removed from the acid resistant material. Next, at least a portion of the drilled ceramic substrate is immersed in an acid bath and then removed therefrom. The substrate is then stripped of the protective layers and cleaned. The cleaned substrate can be baked at a high temperature to loosen or remove additional slag.

BRIEF DESCRIPTION OF THE DRAWINGS

These and further features of the invention may be better understood with reference to the accompanying specification and the drawings in which.

DETAILED DESCRIPTION OF THE INVENTION

The present invention includes a process for removing slag from laser drilled holes in a substrate. A significant benefit of removing laser slag in accordance with the inventive process is that it prevents metalizing over slag and roughness of the hole walls. Because roughness is reduced, the physical vapor deposited (PVD) metal used to provide a metal through-hole lining has a more uniform thickness along the hole wall. Additionally, the disclosed process provides an improved surface for adhesion of the PVD metal to the substrate, which significantly reduces or eliminates blistering and improves mechanical integrity. Thus, any tendency for pieces of a metallic covering (sputtered and/or plated) to flake off either in thermal cycling or due to mechanical causes is greatly reduced. Mechanical causes include impacts to the substrate, ultrasonic vibration, and sawing into the hole. Stability is also improved when soldering a connection to the substrate in the region of a plated through-hole.

We have found that most of the slag on hole walls can be effectively and quickly removed by washing or immersing the substrate with a chemical, such as hot phosphoric acid ($H_3PO_4$). However, the chemical simultaneously and unacceptably deteriorates the other surfaces of the substrate, such as the front and back sides, which are even more readily accessible to the chemical than the walls of the through-holes.

Significantly, we have found that the considerable benefits obtainable by chemically removing slag from a substrate are preserved by providing the front and back surfaces of the substrate with a coating resistant to the effects of the chemical and then removing the coating. The process of the invention is described hereinbelow in greater detail.

Figure 1:
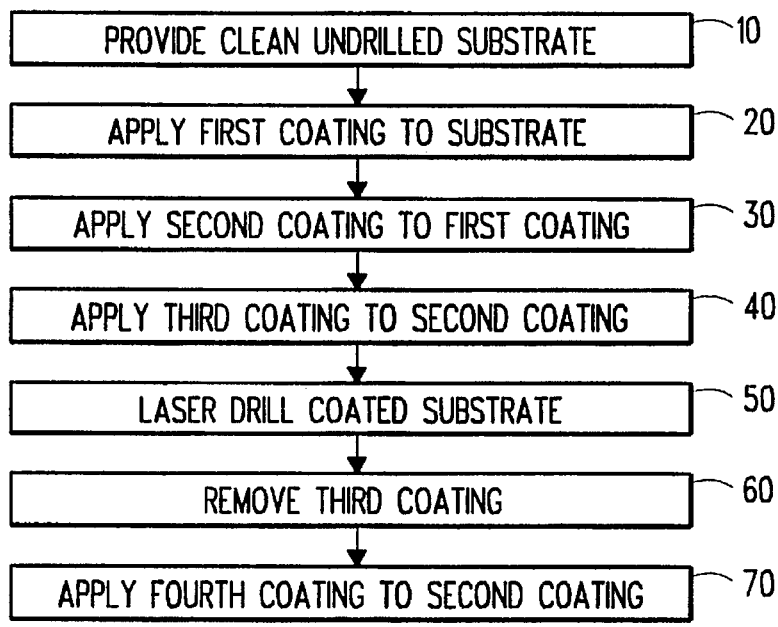
FIG. 1 is a flow chart of process steps for preparing a substrate for chemical slag removal.

FIG. 1 is a flow chart of process steps for preparing a substrate for chemical slag removal, wherein a clean undrilled substrate comprising a refractory oxide (ceramic) or glass is provided, in a step 10. In an illustrative example, the substrate is a 20 mil thick plate of alumina (99.6% aluminum oxide). The substrate must be sufficiently clean so that a subsequently applied coating adheres to the surface of the substrate.

In a second step 20, a first coating is applied to either or both sides of the substrate. In one example, the first coating is a sputtered, adhesion-promotion layer including tungsten-titanium (TiW), having an 80:20 mass ratio, and a thickness of about 250Å. The first coating is then covered by a second layer such as gold (Au) in step 30. In the illustrative example, the second layer is gold having a thickness of 1,200Å. Additional layers are possible, for example, to provide resistance to a chemical agent such that the thickness of expensive gold can be reduced. Exemplary additional layers include sputtered on polytetrafluorethylene and spin-on glass (SOG). Important considerations in selecting a material for the second coating include its adherence properties with respect to a selected first coating material or substrate surface and its reactivity with respect to chemicals used in subsequent process steps. Additionally, the first and second coatings should be easily removable from the substrate at the conclusion of certain process steps. If the second coating material will adhere to the substrate without an intermediate coating, the first coating can be omitted.

In a step 40, a third coating is applied to the second coating to protect it from bits of hot material ejected from the substrate by laser drilling in a subsequent process step. An exemplary third coating is an organic coating including a lacquer that is spun on to provide a coating thickness of 2 microns.

In a step 50, holes vias, slots, or other shaped apertures are laser drilled in the substrate using techniques known to those skilled in the art. In an illustrative embodiment, the holes have a 20 mil diameter.

In a step 60, the third coating, along with bits of ejecta from the substrate, is removed from the second coating by softening and fragmenting the coating in solvents and gently removing it, taking care not to significantly scratch the underlying second coating.

A fourth coating is applied to the now exposed second coating in a step 70, taking care not to coat the interior walls of the drilled holes. In an exemplary embodiment, the fourth layer is gold applied by electroplating to provide a coating about 40 to 70 micro-inches thick. The thickness range chosen for the gold layer is somewhat dependent on the roughness and defects of the original surface of the substrate. The substrate is now ready for chemical removal of laser slag within the through-holes.

Figure 2:
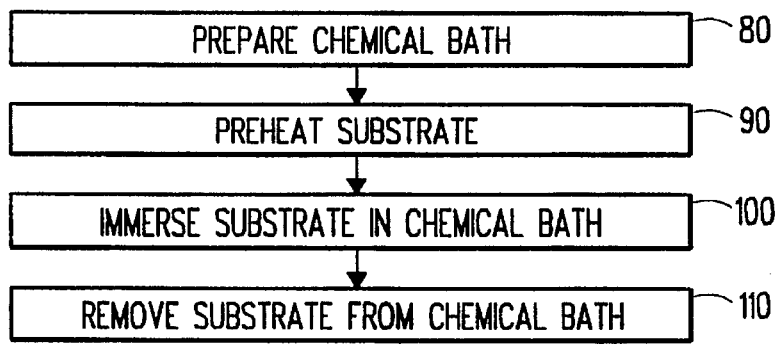
FIG. 2 is a flow chart of process steps for chemical slag removal.

Referring now to FIG. 2, process steps directed to chemical laser slag removal are illustrated. In an illustrative example, a chemical bath, such as hot phosphoric acid, is prepared in a step 80 by treating dummy alumina plates for at least two hours at about 198° C. Treating dummy plates brings down an initially high slag removal rate to a more constant rate.

In a step 90, one or more substrates are preheated up to the temperature of the chemical bath. If a carrier is used to manipulate the substrate(s), the carrier is also preheated. An acceptable carrier for a hot phosphoric acid bath is made of polytetrafluoroethylene.

The substrate(s) are immersed into the chemical bath in a step 100. Considerations for selecting the temperature of an exemplary hot phosphoric acid bath include the type of heater available and the effect of the hot acid on the life of the container for the bath. Generally, for a given acid concentration, the hotter the acid, the faster the slag is removed. For example, an 85% concentration of phosphoric acid heated to about 200°–214° C. obtains good results for an alumina substrate. As a safety precaution, the temperature of the phosphoric acid should be raised very slowly after it is above 130° C.

After a predetermined period of time, the substrate is removed from the chemical bath in a step 110. Considerations in selecting the duration of the chemical bath include the temperature of the bath; the thickness of the substrate; the hole diameter of the smallest holes; and the roughness of the drilled hole wall.

Figure 3:
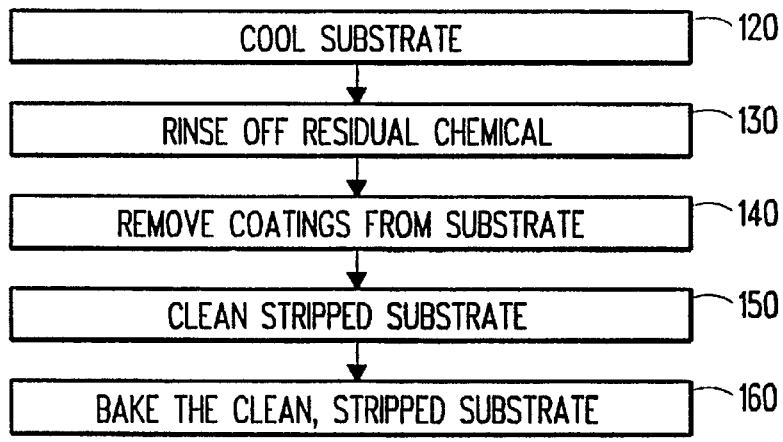
FIG. 3 is a flow chart of process steps subsequent to chemical slag removal.

FIG. 3 is a flow chart of process steps subsequent to chemical slag removal. As illustrated, the substrate, having been removed from the chemical bath, is allowed to cool, in a step 120, so that it will not crack. Any remaining acid is rinsed off of the substrate with clean, deionized water in a step 130.

The coatings are removed from the substrate using standard liquid etchants for stripping the respective coatings in a step 140. For example, gold can be stripped using cyanide and TiW can be stripped with a hydrogen peroxide solution. The stripped plates can then be cleaned, in a step 150, by an ultrasonic soak in clean, deionized water.

Although the preceding process steps provide a significant reduction in slag, additional slag particles can be flaked off of the clean substrate in a step 160, by baking them for about an hour at least 1,000° C.

Although the invention has been shown and described with respect to exemplary embodiments thereof, various other changes, omissions and additions in form and detail thereof may be made therein without departing from the spirit and scope of the invention.

What is claimed is:

1. A process for preparing a substrate for through-hole metalization, comprising the steps of:

providing a ceramic substrate having a first side and a second side;

coating said first side and said second side with an adhesion-promoting material;

coating said adhesion-promoting material with an acid resistant material;

coating said acid resistant material with an organic coating to provide a coated ceramic substrate;

laser drilling at least one aperture through said coated ceramic substrate to provide a drilled substrate;

removing said organic coating from said acid resistant material;

immersing at least a portion of said drilled ceramic substrate in an acid bath;

removing said drilled ceramic substrate from said acid bath;

removing said acid resistant material from said drilled ceramic substrate; and removing said adhesion-promoting material from said drilled ceramic substrate.

2. The process of claim 1, further including the step of heating said acid bath.

3. The process of claim 2, wherein said ceramic substrate comprises alumina.

4. The process of claim 3, wherein said adhesion-promoting material includes tungsten-titanium (TiW).

5. The process of claim 4, wherein said acid resistant material includes gold.

6. The process of claim 1, further comprising the step of baking said drilled ceramic substrate at a temperature in excess of 1,000° C.

7. A process for removing slag from an aperture in a substrate, comprising the steps of:

providing an acid-resistant protective coating including gold on said substrate;

drilling a hole through said substrate; and chemically removing slag from said aperture.

8. The process of claim 7, wherein said step of chemically removing slag includes the step of washing said substrate in acid.

9. The process of claim 7, wherein said step of chemically removing slag includes the step of immersing at least a portion of said substrate in an acid bath.

10. A process for removing slag from an aperture in a substrate, comprising the steps of:

provic a protective coating on said substrate;

drilling a hole through said substrate;

chemically removing slag from said aperture; and baking said substrate after said step of chemically removing slag.

11. The process of claim 10, wherein said step of providing a protective coating includes deposition of a coating material that is resistant to a chemical used in said step of chemically removing slag.

12. The process of claim 11, wherein said coating is acid resistant.

13. The process of claim 10, wherein said step of drilling a hole includes the step of laser drilling.

14. A process for removing slag from an aperture in a substrate, comprising the steps of:

providing an acid-resistant protective coating including on said substrate;

drilling a hole through said substrate; and chemically removing slag from said aperture, including the step of immersing at least a portion of said substrate in a phosphoric acid bath.

15. The process of claim 14, further including the step of heating said phosphoric acid.

16. A process for preparing a substrate, comprising the steps of:

providing a planar substrate having a first side and a second side;

coating said first side and said second side with a protective material to provide a coated substrate;

laser drilling at least one aperture through said coated substrate to provide a drilled substrate;

immersing at least a portion of said drilled substrate in a phosphoric acid chemical bath;

removing said drilled substrate from said chemical bath; and removing said protective material from said drilled substrate.

17. The process of claim 16, further comprising the step of heating said phosphoric acid.

18. A process for preparing a substrate, comprising the steps of:

providing a planar substrate having a first side and a second side;

coating said first side and said second side with a protective material to provide a coated substrate;

laser drilling at least one aperture through said coated substrate to provide a drilled substrate;

immersing at least a portion of said drilled substrate in a chemical bath;

removing said drilled substrate from said chemical bath; and removing said protective material from said drilled substrate; and baking said drilled substrate subsequent to said step of removing said protective material.

19. The process of claim 18, wherein said step of coating includes the step of deposition of a coating material that is resistant to said chemical bath.

20. A process for preparing a substrate, comprising the steps of:

providing a planar substrate having a first side and a second side;

coating said first side and said second side with a protective material including gold to provide a coated substrate;

laser drilling at least one aperture through said coated substrate to provide a drilled substrate;

immersing at least a portion of said drilled substrate in a chemical bath;

removing said drilled substrate from said chemical bath; and removing said protective material from said drilled substrate.

* * * * *